United States Patent
Gong et al.

(10) Patent No.: US 10,651,738 B2
(45) Date of Patent: May 12, 2020

(54) CURRENT SAMPLING CIRCUIT APPLIED TO A MULTI-MODE CIRCUIT AND ASSOCIATED CONTROL METHOD

(71) Applicant: Chengdu Monolithic Power Systems Co. Ltd., Chengdu (CN)

(72) Inventors: Junyong Gong, Chengdu (CN); Jian Zhang, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 16/208,550

(22) Filed: Dec. 3, 2018

(65) Prior Publication Data

US 2019/0173370 A1 Jun. 6, 2019

(30) Foreign Application Priority Data

Dec. 4, 2017 (CN) .......................... 2017 1 1259934

(51) Int. Cl.
*H02M 3/158* (2006.01)
*H02M 1/00* (2006.01)

(52) U.S. Cl.
CPC .. *H02M 3/1582* (2013.01); *H02M 2001/0009* (2013.01)

(58) Field of Classification Search
CPC ................. H02M 3/1582; H02M 2001/0009
See application file for complete search history.

(56) References Cited

U.S. PATENT DOCUMENTS

| | | | |
|---|---|---|---|
| 8,472,217 B2 | 6/2013 | Li | |
| 8,896,278 B2 | 11/2014 | Ouyang | |
| 9,071,142 B2 | 6/2015 | Yang | |
| 9,819,279 B2 * | 11/2017 | Stewart | H02M 5/293 |
| 9,831,824 B2 * | 11/2017 | Gazit | G01S 3/7861 |
| 10,454,371 B1 * | 10/2019 | Masini | H02M 3/1582 |
| 2010/0314945 A1 * | 12/2010 | Yamazaki | H02M 3/157 307/80 |
| 2011/0156683 A1 * | 6/2011 | Zhang | H02M 3/1582 323/283 |
| 2013/0162171 A1 * | 6/2013 | Ishii | G05F 1/618 315/291 |
| 2015/0069958 A1 * | 3/2015 | Yang | H02J 7/0052 320/107 |
| 2015/0162835 A1 * | 6/2015 | Hang | H02M 3/1582 323/271 |
| 2015/0303803 A1 * | 10/2015 | Chen | H02M 3/158 323/271 |

(Continued)

*Primary Examiner* — Fred E Finch, III
*Assistant Examiner* — Rafael O. De León Domenech
(74) *Attorney, Agent, or Firm* — Perkins Coie LLP

(57) ABSTRACT

A multi-mode circuit has a first switch, a second switch, a third switch and a fourth switch. A current sampling circuit applied to the buck-boost has a first sampling circuit, a second sampling circuit and a current processing circuit. The first sampling circuit generates a first sampling current by sampling the current flowing through the first switch, the second sampling circuit generates a second sampling current by sampling the current flowing through the second switch, and the current processing circuit generates a third sampling current based on the first sampling current and the second sampling current. An average value of the third sampling current of one cycle represents the output current of the multi-mode circuit.

20 Claims, 5 Drawing Sheets

(56) References Cited

U.S. PATENT DOCUMENTS

| | | | |
|---|---|---|---|
| 2015/0365000 A1* | 12/2015 | Dhuyvetter | H02M 3/1582 |
| | | | 323/271 |
| 2016/0087531 A1* | 3/2016 | Zhang | H02M 3/1582 |
| | | | 323/271 |
| 2016/0094125 A1* | 3/2016 | Milanesi | H02M 3/1584 |
| | | | 323/271 |
| 2016/0105110 A1* | 4/2016 | Houston | H02M 3/1582 |
| | | | 323/271 |
| 2016/0190931 A1* | 6/2016 | Zhang | H02M 3/1582 |
| | | | 323/271 |
| 2018/0246147 A1 | 8/2018 | Reymond | |
| 2019/0305685 A1* | 10/2019 | Miki | H02M 3/155 |

* cited by examiner

CURRENT SAMPLING CIRCUIT APPLIED TO A MULTI-MODE CIRCUIT AND ASSOCIATED CONTROL METHOD

This application claims the benefit of CN application No. 201711259934.7, filed on Dec. 4, 2017, and incorporated herein by reference.

TECHNICAL FIELD

The present invention relates to electrical circuit, more particularly but not exclusively relates to a current sampling circuit applied to a multi-mode circuit.

BACKGROUND

To sample the current of a multi-mode circuit, a traditional method is to add an external resistance in parallel. As shown in FIG. 1, a traditional current sampling circuit applied to a multi-mode circuit comprises a first MOSFET (Metal Oxide Semiconductor Field Effect Transistor) SWA, a second MOSFET SWB, a third MOSFET SWC, a fourth MOSFET SWD, an inductance L and a sampling resistance Rs, wherein the sampling resistance Rs is coupled to the drain of the fourth MOSFET SWD. An output current Iout will be obtained by calculating the voltage Vs across the sampling resistance Rs.

However, for the external sampling resistance Rs, energy is dissipated and lost, and two extra pins are needed to couple the sampling resistance Rs, so the cost is also increased.

SUMMARY

It is one of the objects of the present invention to provide a novel sampling circuit applied to a multi-mode circuit and associated control method to solve the above problems.

One embodiment of the present invention discloses a power switching circuit, comprising: a multi-mode circuit, comprising a first switch, a second switch, a third switch and a fourth switch, wherein the multi-mode circuit is configured to work in buck mode, boost mode or buck-boost mode; a current sampling circuit, coupled to the first switch and the fourth switch, and configured to provide a first sampling current representing a current flowing through the first switch and to provide a second sampling current representing a current flowing through the fourth switch; and a current processing circuit, configured to generate a third sampling current based on the first sampling current and the second sampling current, wherein the third sampling current equals to the second sampling current during an entire period when the multi-mode circuit works in buck mode, the third sampling current equals to the first sampling current during a period when the fourth switch is on and equals to zero otherwise when the multi-mode circuit works in boost mode, the third sampling current equals to zero during a first period, equals to the first sampling current during a second period, and equals to the second sampling current during a third period and a fourth period when the multi-mode circuit works in buck-boost mode; wherein one cycle of the buck-boost mode comprises four periods: the first period, the second period, the third period and the fourth period.

Another embodiment of the present invention discloses a current sampling circuit applied to a multi-mode circuit, wherein the multi-mode circuit comprises a first switch, a second switch, a third switch and a fourth switch, the multi-mode circuit is configured to work in buck mode, boost mode or buck-boost mode, the current sampling circuit comprising: a first sampling circuit, configured to provide a first sampling current representing the current flowing through the first switch; a second sampling circuit, configured to provide a second sampling current representing the current flowing through the fourth switch; and a current processing circuit, configured to generate a third sampling current based on the first sampling current and the second sampling current, wherein the third sampling current equals to the second sampling current during an entire period when the multi-mode circuit works in buck mode, the third sampling current equals to the first sampling current during a period when the fourth switch is on and equals to zero otherwise when the multi-mode circuit works in boost mode, the third sampling current equals to zero during a first period, equals to the first sampling current during a second period, and equals to the second sampling current during a third period and a fourth period when the multi-mode circuit works in buck-boost mode; wherein one cycle of the buck-boost mode comprises four periods: the first period, the second period, the third period and the fourth period.

Yet another embodiment of the present invention discloses control method for a current sampling circuit applied to a multi-mode circuit, wherein the multi-mode circuit comprises a first switch, a second switch, a third switch and a fourth switch, the multi-mode circuit is configured to work in buck mode, boost mode or buck-boost mode, the control method comprising: generating a first sampling current representing a current flowing through the first switch; generating a second sampling current representing a current flowing through the fourth switch; and generating a third sampling current based on the first sampling current and the second sampling current; wherein the third sampling current equals to the second sampling current during an entire period when the multi-mode circuit works in buck mode, the third sampling current equals to the first sampling current during a period when the fourth switch is on and equals to zero otherwise when the multi-mode circuit works in boost mode, the third sampling current equals to zero during a first period, equals to the first sampling current during a second period, and equals to the second sampling current during a third period and a fourth period when the multi-mode circuit works in buck-boost mode, wherein one cycle of the buck-boost mode comprises four periods: the first period, the second period, the third period and the fourth period.

According to the embodiments of the present invention, the current sampling circuit applied to a multi-mode circuit can reduce the loss of the power source and the number of pins, and can also reduce the cost.

BRIEF DESCRIPTION OF THE DRAWINGS

Non-limiting and non-exhaustive embodiments are described with reference to the following drawings.

The use of the same reference label in different drawings indicates the same or like components.

DETAILED DESCRIPTION

In the present application, numerous specific details are provided, such as examples of circuits, components, and methods, to provide a thorough understanding of embodiments of the invention. These embodiments are exemplary, not to confine the scope of the invention. Persons of ordinary skills in the art will recognize, however, that the invention can be practiced without one or more of the specific details. In other instances, well-known details are not shown or described to avoid obscuring aspects of the invention. Some phrases are used in some exemplary embodiments. However, the usage of these phrases is not confined to these embodiments.

Figure 1:
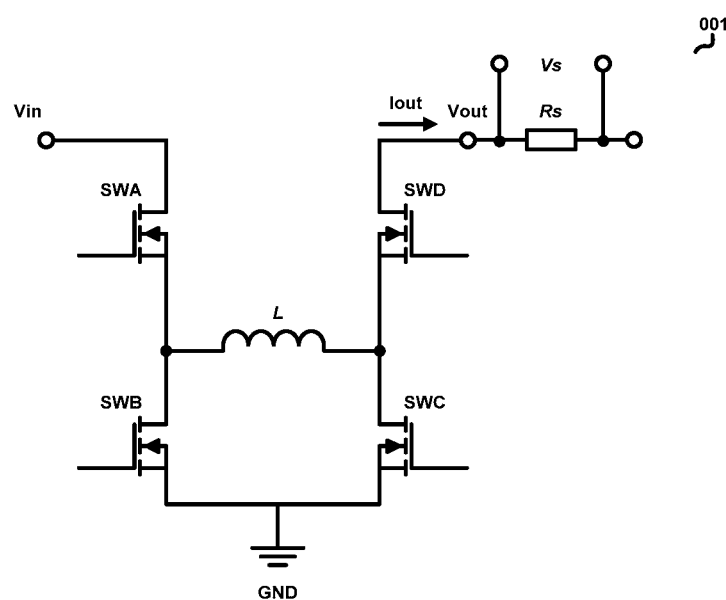
FIG. 1 illustrates a circuit block of a traditional sampling circuit applied to a multi-mode circuit 001 according to an embodiment of the present invention.
Figure 2:
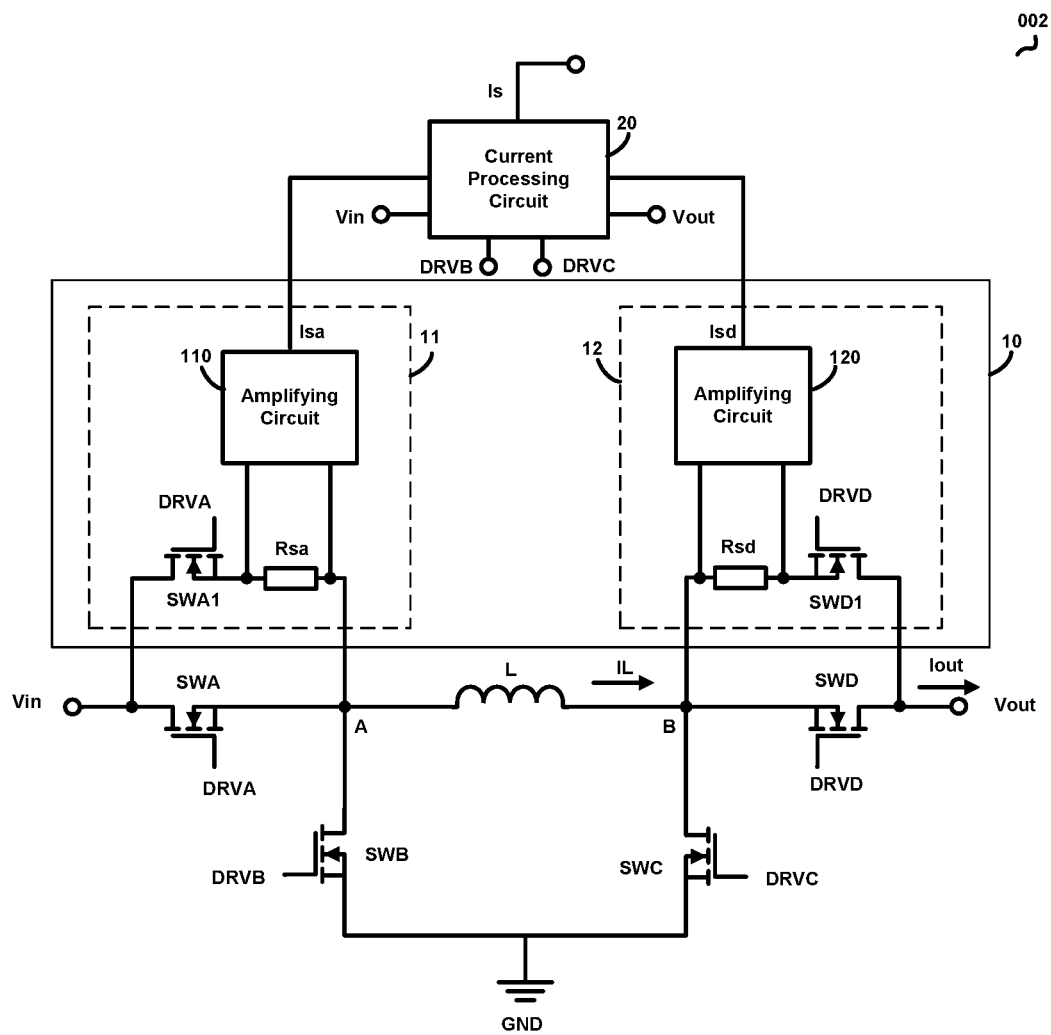
FIG. 2 schematically illustrates a current sampling circuit 002 applied to a multi-mode circuit according to an embodiment of the present invention.

FIG. 2 schematically illustrates a current sampling circuit 002 applied to a multi-mode circuit according to an embodiment of the present invention. The multi-mode circuit comprises a first switch SWA, a second switch SWB, a third switch SWC and a fourth switch SWD, and the multi-mode circuit is configured to work in buck mode, boost mode or buck-boost mode. when the multi-mode circuit works in buck mode, the third switch SWC is off, the fourth switch SWD is on, and the first switch SWA and the second switch SWB are turned on and off alternately; when the multi-mode circuit works in boost mode, the first switch SWA is on, the second switch SWB is off, the third switch SWC and the fourth switch SWD are turned on and off alternately; and when the multi-mode circuit works in buck-boost mode, during a first period, the first switch SWA and the third switch SWC are on, the second switch SWB and the fourth switch SWD are off, during a second period, the first switch SWA and the fourth switch SWD are on, the second switch SWB and the third switch SWC are off, during a third period, the second switch SWB and the fourth switch SWD are on, the first switch SWA and the third switch SWC are off, and during a fourth period, the first switch SWA and the fourth switch SWD are on, the second switch SWB and the third switch SWC are off, wherein one cycle of the buck-boost mode comprises four periods: the first period, the second period, the third period and the fourth period.

The current sampling circuit 002 comprises: a reference ground GND, an inductance L, a current sampling circuit 10 and a current processing circuit 20. Each of the first switch SWA, the second switch SWB, the third switch SWC, and the fourth switch SWD has a source, a drain and a gate. Wherein the reference ground provides a reference ground for the novel current sampling circuit 002. In the embodiment in FIG. 2, the first switch, the second switch, the third switch and the fourth switch can be MOSFETs. The first switch SWA has a source, a drain and a gate, wherein the drain of the first switch SWA is configured to receive an input voltage Vin, the gate of the first switch SWA is configured to receive a first gate driving signal DRVA. The second switch SWB has a source, a drain and a gate, wherein the drain of the second switch SWB is coupled to the source of the first switch SWA, the source of the second switch SWB is coupled to the reference ground GND, the gate of the second switch SWB is configured to receive a second gate driving signal DRVB. The third switch SWC has a source, a drain and a gate, wherein the source of the third switch SWC is coupled to the reference ground GND, the gate of the third switch SWC is configured to receive a third gate driving signal DRVC. The fourth switch SWD has a source, a drain and a gate, wherein the source of the fourth switch SWD is coupled to the drain of the third switch SWC, the drain of the fourth switch SWD is configured to provide an output voltage Vout, the gate of the fourth switch SWD is configured to receive a fourth gate driving signal DRVD. The inductance L comprises a first terminal and a second terminal, wherein the first terminal of the inductance L is coupled to a common point A of the source of the first switch SWA and the drain of second switch SWB, the second terminal of the inductance L is coupled to a common point B of the drain of the third switch SWC and the source of the fourth switch SWD, wherein current IL is the current flowing through the inductance IL. In one embodiment, the reference ground GND, the first switch SWA, the second switch SWB, the third switch SWC, the fourth switch SWD and the inductance L constitute the multi-mode circuit.

In the embodiment illustrated in FIG. 2, the current sampling circuit 10 is coupled to the first switch SWA and the fourth switch SWD, and configured to sample a current flowing through the first switch SWA and a current flowing through the fourth switch SWD, and the current sampling circuit 10 is configured to provide a first sampling current Isa representing the current flowing through the first switch SWA and to provide a second sampling current Isd representing the current flowing through the fourth switch SWD. In one embodiment, the current sampling circuit 10 comprises a first sampling circuit 11 and a second sampling circuit 12. Wherein the first sampling circuit 11 is configured to sample the current flowing through the first switch SWA, comprising a first input terminal, a second input terminal and an output terminal, wherein the first input terminal of the first sampling circuit 11 is coupled to the drain of the first switch SWA, the second input terminal of the first sampling circuit 11 is coupled to the source of the first switch SWA, the output terminal of the first sampling circuit 11 is configured to provide the first sampling circuit Isa. The second sampling circuit 12 is configured to sample the current flowing through the fourth switch SWD, comprising a first input terminal, a second input terminal and an output terminal, wherein the first input terminal of the second sampling circuit 12 is coupled to the source of the fourth switch SWD, the second input terminal of the second sampling circuit 12 is coupled to the drain of the fourth switch SWD, the output terminal of the current sampling circuit 12 is configured to provide the second sampling current Isd.

In one embodiment, the first sampling circuit 11 comprises a first transistor SWA1, a first sampling resistance Rsa and a first amplifying circuit 110. In the embodiment illustrated in FIG. 2, the first transistor can be a MOSFET. The first transistor SWA has a source, a drain and a gate, wherein the drain of the first transistor SWA1 is coupled to the drain of the first switch SWA, and the gate of the first transistor SWA1 is configured to receive the first gate driving signal DRVA. The first sampling resistance Rsa comprises a first terminal and a second terminal, wherein the first terminal of the first sampling resistance Rsa is coupled to the source of the first transistor SWA1, the second terminal of the first sampling resistance Rsa is coupled to the source of the first switch SWA. The first amplifying circuit 110 is configured to receive a voltage across the first sampling resistance Rsa, and configured to amplify the voltage across the first sampling resistance Rsa and provide the first sampling current Isa. In one embodiment, the first amplifying circuit 110 is configured to be a signal amplifier.

In one embodiment, the second sampling circuit 12 comprises a second transistor SWD1, a second sampling resistance Rsd and a second amplifying circuit 120. In the embodiment illustrated in FIG. 2, the second transistor can be a MOSFET. Wherein the second transistor SWD1 has a source, a drain and a gate, the drain of the second transistor SWD1 is coupled to the drain of the fourth switch SWD, the gate of the second transistor SWD1 is configured to receive the fourth gate driving signal DRVD. The second sampling resistance Rsd comprises a first terminal and a second terminal, wherein the first terminal of the second sampling resistance Rsd is coupled to the source of the second transistor SWD1, the second terminal of the second sampling resistance Rsd is coupled to the source of the fourth switch SWD. The second amplifying circuit 120 is configured to receive a voltage across the second sampling resistance Rsd, and configured to amplify the voltage across the second sampling resistance Rsd and provide the second sampling current Isd. In one embodiment, the second amplifying circuit 120 is configured to be a signal amplifier.

In one embodiment, the current processing circuit 20 comprises a first input terminal to receive the first sampling current Isa, a second input terminal to receive the second sampling current Isd, a third input terminal to receive an input voltage Vin of the multi-mode circuit, a fourth input terminal to receive an output voltage Vout of the multi-mode circuit, a fifth input terminal to receive the second gate driving signal DRVB, a sixth input terminal to receive the third driving signal DRVC, and an output terminal to provide the third sampling current Is.

In the embodiment illustrated in FIG. 2, the current processing circuit 20 is coupled to the current sampling circuit 10 to receive the first sampling current Isa and the second sampling current Isd, and configured to generate a third sampling current Is based on the first sampling current Isa and the second sampling current Isd, wherein an average value of the third sampling current Is of one cycle represents an output current Iout of the multi-mode circuit.

Figure 3:
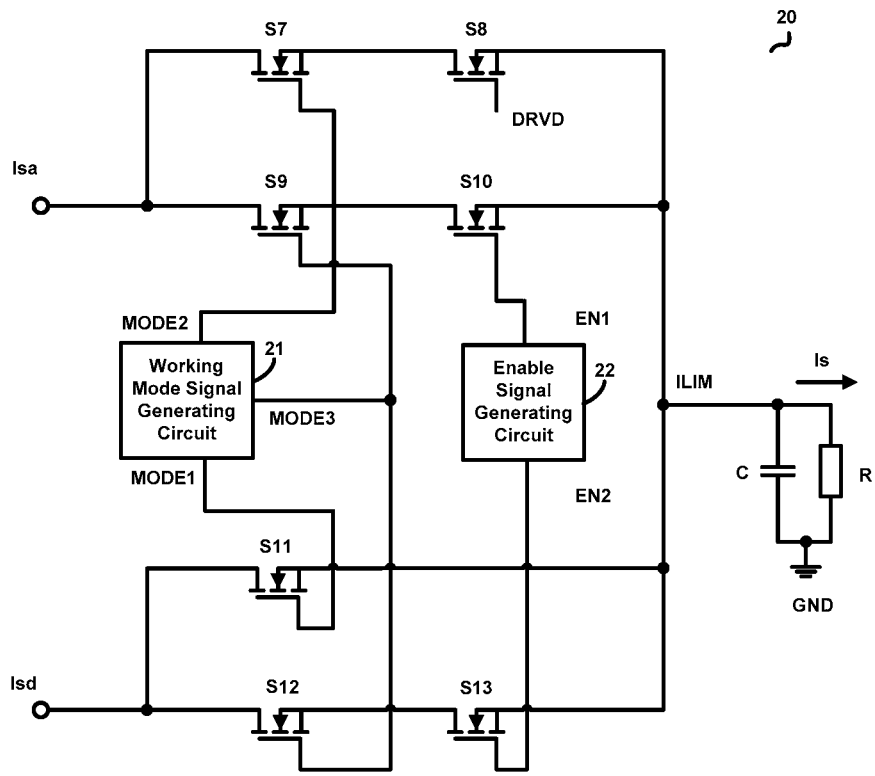
FIG. 3 schematically illustrates a current processing circuit 20 shown in FIG. 2 according to an embodiment of the present invention.

FIG. 3 schematically illustrates the current processing circuit 20 shown in FIG. 2 according to an embodiment of the present invention. In one embodiment, the current processing circuit 20 comprises a working mode signal generating circuit 21 and an enable signal generating circuit 22. The working mode signal generating circuit 21 is configured to generate a buck mode signal MODE1, a boost mode signal MODE2 and a buck-boost mode signal MODE3 based on the input voltage Vin and the output voltage Vout. In one embodiment, only one of the buck mode signal MODE1, the boost mode signal MODE2 and the buck-boost mode signal MODE3 is logic high at a time. When the buck mode signal MODE1 is logic high, the multi-mode circuit is configured to work in buck mode, the third switch SWC is configured to be turned off, the fourth switch SWD is configured to be turned on, the first switch SWA and the second switch SWB are configured to be turned on and off alternately. When the boost mode signal MODE2 is logic high, the multi-mode circuit is configured to work in the boost mode, the first switch SWA is configured to be turned on, the second switch SWB is configured to be turned off, the third switch SWC and the fourth switch SWD are configured to be turned on and off alternately. When the buck-boost mode signal MODE3 is logic high, the multi-mode circuit is configured to work in the buck-boost mode, the first switch SWA, the second switch SWB, the third switch SWC and the fourth switch SWD are configured to be turned on and off in pairs. The enable signal generating circuit 22 is configured to generate a first enable signal EN1 and a second enable signal EN2 based on the second gate driving signal DRVB and the third gate driving signal DRVD. In one embodiment, only during a period from the third switch SWC is turned off to the second switch SWB is turned on, the first enable signal EN1 is logic high. Only during a period from the second switch SWB is turned on to the third switch SWC is turned on, the second enable signal EN2 is logic high.

In the embodiment illustrated in FIG. 3, the current processing circuit 20 comprises a third transistor S7, a fourth transistor S8, a fifth transistor S9, a sixth transistor S10, a seventh transistor S11, an eighth transistor S12 and a ninth transistor S13. In the embodiment illustrated in FIG. 3, the third transistor S7, the fourth transistor S8, the fifth transistor S9, the sixth transistor S10, the seventh transistor S11, the eighth transistor S12 and the ninth transistor S13 can be MOSFETs. Each of the third transistor S7, the fourth transistor S8, the fifth transistor S9, the sixth transistor S10, the seventh transistor S11, the eighth transistor S12 and the ninth transistor S13 has a source, a drain and a gate. Wherein the drain of the transistor S7 is configured to receive the first sampling current Isa, the gate of the transistor S7 is configured to receive the boost mode signal MODE2. The drain of the fourth transistor S8 is coupled to the source of the third transistor S7, the gate of the fourth transistor S8 is configured to receive the fourth gate driving signal DRVD. The drain of the fifth transistor S9 is coupled to drain of the third transistor S7 to receive the first sampling current Isa, the gate of the fifth transistor S9 is configured to receive the buck-boost mode signal MODE3. The drain of the sixth transistor S10 is coupled to the drain of the fifth transistor S9, the gate of the sixth transistor S10 is configured to receive the first enable signal EN1. The drain of the seventh transistor S11 is configured to receive the second sampling current Isd, the gate of the seventh transistor S11 is configured to receive the buck mode signal MODE1. The drain of the eighth transistor S12 is coupled to the drain of the seventh transistor S11 to receive the second sampling current Isd, the gate of the eighth transistor S12 is configured to receive the buck-boost mode signal MODE3. The drain of the ninth transistor S13 is coupled to the source of the eighth transistor S12, the gate of the ninth transistor S13 is configured to receive the second enable signal EN2. Wherein the source of the fourth transistor S8, the source of the sixth transistor S10, the source of the seventh transistor S11 and the source of the ninth transistor S13 are coupled to a common point ILIM, and the common point ILIM is configured to provide the third sampling current Is.

In the embodiment illustrated in FIG. 3, the current processing circuit 20 comprises a capacitor C and an output resistance R. The capacitor C comprises a first terminal and a second terminal, wherein the first terminal of the capacitor C is coupled to the common point ILIM to receive the third sampling current Is, the second terminal of the capacitor C is coupled to the reference ground GND. The output resistance R comprises a first terminal and a second terminal, wherein the first terminal of the output resistance R is coupled to the common point ILIM to receive the third sampling current Is, the second terminal of the output resistance R is coupled to the reference ground GND. Wherein the first terminal of the capacitor C is coupled to the first terminal of the output resistance R, the second terminal of the capacitor C is coupled to the second terminal of the output resistance R, the capacitor C and the output resistance R are configured to obtain the average value of the third sampling current Is of one cycle.

Figure 4:
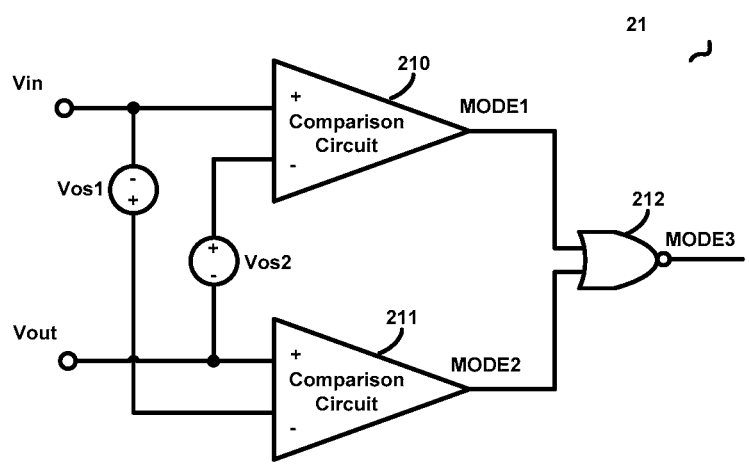
FIG. 4 schematically illustrates a working mode signal generating circuit 21 shown in FIG. 3 according to an embodiment of the present invention.

FIG. 4 schematically illustrates the working mode signal generating circuit 21 shown in FIG. 3 according to an embodiment of the present invention. The working mode signal generating circuit 21 comprises a first bias source Vos1, a second bias source Vos2, a first comparison circuit 210, a second comparison circuit 211 and an NOR gate 212. Wherein the first bias source Vos1 is configured to provide a first bias voltage Vos1, and the first bias source Vos1 comprises a positive terminal and a negative terminal, wherein the negative terminal is coupled to the input voltage Vin. The second bias source Vos2 is configured to provide a second bias voltage Vos2, and the second bias source Vos2 comprises a positive terminal and a negative terminal, wherein the negative terminal of the second bias source Vos2 is coupled to the output voltage Vout.

In one embodiment, the first comparison circuit 210 comprises a first input terminal, a second input terminal and an output terminal, wherein the first input terminal of the first comparison circuit 210 is configured to receive the input voltage Vin, the second input terminal of the first comparison circuit 210 is coupled to the positive terminal of the second bias source Vos2 to receive a first voltage signal Vout+Vos2 which is a sum of the output voltage Vout and the second bias voltage Vos2. The first comparison circuit 210 is configured to generate the buck mode signal MODE1 based on a compare result of the input voltage Vin and the first voltage signal Vout+Vos2. The output terminal of the first comparison circuit 210 is configured to provide the buck mode signal MODE1. When the input voltage Vin is greater than the first voltage signal Vout+Vos2, the buck mode signal MODE1 is logic high, and when the input voltage Vin is less than or equal to the first voltage signal Vout+Vos2, the buck mode signal MODE1 is logic low. In one embodiment, the first comparison circuit 210 is a signal comparator.

In one embodiment, the second comparison circuit 211 comprises a first input terminal, a second input terminal and an output terminal. Wherein the first terminal of the second comparison circuit 211 is configured to receive the output voltage Vout, the second input terminal of the second comparison circuit 211 is coupled to the positive terminal of the first bias source Vos1 to receive a second voltage signal Vin+Vos1 which is a sum of the input voltage Vin and the first bias voltage Vos1. The second comparison circuit 211 is configured to generate the boost mode signal MODE2 based on a compare result of the output voltage Vout and the second voltage signal Vin+Vos1. The output terminal of the second comparison circuit 211 is configured to provide the boost mode signal MODE2. When the output voltage Vout is greater than the second voltage signal Vin+Vos1, the boost mode signal MODE2 is logic high, and when the output voltage Vout is less than or equal to the second voltage signal Vin+Vos1, the boost mode signal MODE2 is logic low. In one embodiment, the second comparison circuit 211 is a signal comparator.

In one embodiment, the NOR gate 212 comprises a first input terminal, a second input terminal and an output terminal, wherein the first input terminal of the NOR gate 212 is coupled to the output terminal of the first comparison circuit 210 to receive the buck mode signal MODE1, and the second input terminal of the NOR gate 212 is coupled to the output terminal of the second comparison circuit 211 to receive the boost mode signal MODE2. The NOR gate 212 is configured to generate the buck-boost mode signal MODE3 based on the buck mode signal MODE1 and the boost mode signal MODE2, and the output terminal of the NOR gate 212 is configured to provide the buck-boost mode signal MODE3. When the buck mode signal MODE1 or the boost mode signal MODE2 is logic high, the buck-boost mode signal MODE3 is logic low, and only when both the buck mode signal MODE1 and the boost mode signal MODE2 are logic low, the buck-boost mode signal MODE3 is logic high.

In one embodiment, the first bias source Vos1 and the second bias source Vos2 can be excluded. The negative terminal of the first comparison circuit can receive not only the second voltage signal Vos2+Vout but other reference voltage greater than the output voltage Vout, and the negative terminal of the second comparison circuit can receive not only the first voltage signal Vos1+Vin but other reference voltage greater than the input voltage Vin.

Figure 5:
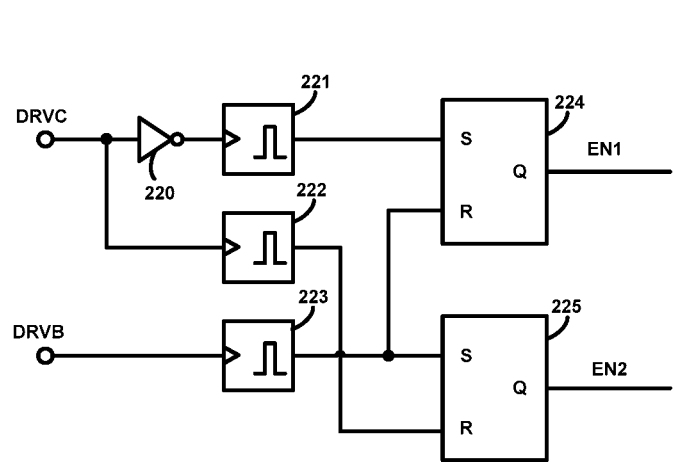
FIG. 5 schematically illustrates an enable signal generating circuit 22 shown in FIG. 3 according to an embodiment of the present invention.

FIG. 5 schematically illustrates the enable signal generating circuit 22 shown in FIG. 3 according to an embodiment of the present invention. The enable signal generating circuit 22 comprises an NOT gate, a first monostable trigger 221, a second monostable trigger 222, a third monostable trigger 223, a first RS trigger 224 and a second RS trigger 225. The NOT gate 220 comprises an input terminal and an output terminal, wherein the input terminal of the NOT gate 220 is configured to receive the third gate driving signal DRVC, and the output terminal of the NOT gate 220 is configured to provide an inverting signal of the third gate driving signal DRVC. The first monostable trigger 221 comprises an input terminal and an output terminal, wherein the input terminal of the first monostable trigger 221 is coupled to the output terminal of the NOT gate 220 to receive the inverting signal of the third driving signal DRV3, and the first monostable trigger 221 is configured to generate a first trigger signal based on the inverting signal of the third gate driving signal. When the first monostable trigger 221 receives a rising edge of the inverting signal of the third gate driving signal DRV, i.e. a falling edge of the third gate driving signal DRV, the first trigger signal turns to logic high and keep logic high for a first predetermined time, otherwise, the first trigger signal is logic low. The second monostable trigger 222 comprises an input terminal and an output terminal, wherein the input terminal of the second monostable trigger 222 is configured to receive the third gate driving signal DRVC. The second monostable trigger 222 is configured to generate a second trigger signal based on the third gate driving signal DRVC. When the second monostable trigger 222 receives a rising edge of the third gate driving signal DRVC, the second trigger signal is logic high and keep logic high for a second predetermined time, otherwise, the second trigger signal is logic low. The third monostable trigger 223 comprises an input terminal and an output terminal, wherein the input terminal of the third monostable trigger 223 is configured to receive the second gate driving signal DRVB, and the third monostable trigger 223 is configured to generate a third trigger signal according to the second gate driving signal DRVB. When the third monostable trigger 223 receives a rising edge of the second gate driving signal DRVB, the third trigger signal is logic high and keep logic high for a third predetermined time, otherwise, the third trigger signal is logic low. The first RS trigger 224 comprises a set terminal S, a reset terminal R and an output terminal Q, wherein the set terminal S of the first RS trigger is coupled to the output terminal of the first monostable trigger 221 to receive the first trigger signal, and the reset terminal R of the first RS trigger 224 is coupled to the output terminal of the third monostable trigger 223 to receive the third trigger signal. The first RS trigger 224 is configured to generate the first enable signal EN1 based on the first trigger signal and the third trigger signal, and the output terminal of the first RS trigger 224 is configured to provide the first enable signal EN1. When the first trigger signal is logic high, the first enable signal EN1 is logic high. When the third trigger signal is logic high, the first enable signal EN1 is logic low. When both the first trigger signal and the third trigger signal are logic low, the first enable signal EN1 keeps unchanged. The second RS trigger 225 comprises a set terminal S, a reset terminal R and an output terminal Q, wherein the set terminal S of the second RS trigger is coupled to the output terminal of the third monostable trigger 223 to receive the third trigger signal, and the reset terminal of the second RS trigger 225 is coupled to the output terminal of the second monostable trigger 222 to receive the second trigger signal. The second RS trigger 225 is configured to generate the second enable signal EN2 based on the second trigger signal and the third trigger signal, and the output terminal of the second RS trigger is configured to provide the second enable signal EN2. When the third trigger signal is logic high, the second enable signal EN2 is logic high. When the second trigger signal is logic high, the second enable signal EN2 is logic low. When both the second trigger signal and the third trigger signal are logic low, the second enable signal EN2 keeps unchanged.

In one embodiment, the enable signal generating circuit can exclude the monostable trigger 221, the monostable trigger 222 and the monostable trigger. The NOT gate 220 can be replaced by other logic circuits.

Figure 6:
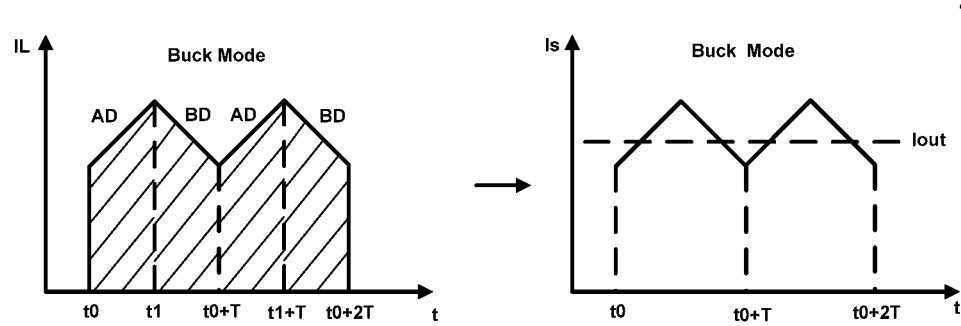
FIG. 6 shows waveforms 003 of an inductive current IL of the inductance L and a third sampling current Is when the multi-mode circuit works in a buck mode according to an embodiment of the present invention.

FIG. 6 shows waveforms 003 of an inductive current IL of the inductance L and the third sampling current Is when the multi-mode circuit works in the buck mode according to an embodiment of the present invention. In one embodiment, when the multi-mode circuit works in the buck mode, the second switch SWC is configured to be turned off, the fourth switch SWD is configured to be turned on, and the first switch SWA and the second switch SWB are configured to be turned on alternately. From a moment t0 to a moment t1, the first switch SWA and the fourth switch SWD are on, the second switch SWB and the third switch SWC are off, the inductive current IL increases with a slope AD, and the third sampling current equals to the second sampling current Isd. From the moment t1 to a moment t0+T, the second switch SWB and the fourth switch SWD are on, the first switch SWA and the third switch SWC are off, the inductive current IL decreases with a slope BD, and the third sampling current equals to the second sampling current Isd. From the moment t0+T to a moment t1+T, the first switch SWA and the fourth switch SWD are on, the second switch SWB and the third switch SWC are off, the inductive current IL increases with the slope AD, and the third sampling current equals to the second sampling current Isd. From the moment t1+T to a moment t0+2T, the second switch SWB and the fourth switch SWD are on, the first switch SWA and the third switch SWC are off, and the inductive current IL decreases with the slope BD, and the third sampling current equals to the second sampling current Isd. As illustrated in the dash area in FIG. 6, during one cycle T, the inductive current IL equals to the fourth switch SWD all the while, that is, when the multi-mode circuit works in buck mode, an average value of the second sampling current Isd of one cycle T represents the output current Iout.

Figure 7:
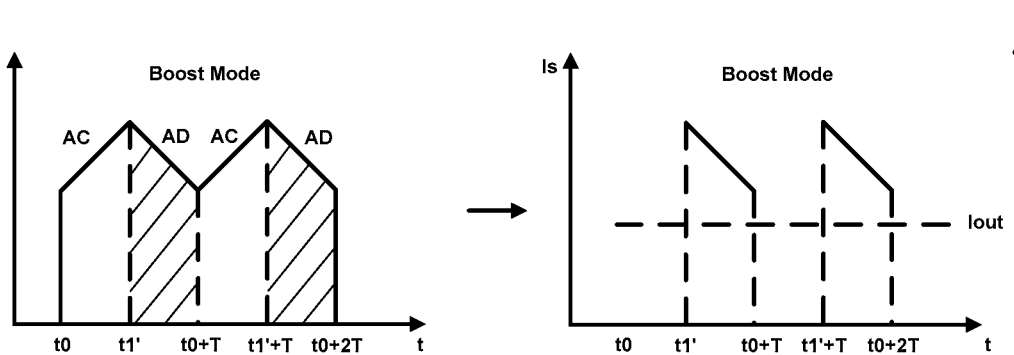
FIG. 7 shows waveforms 004 of the inductive current IL and the third sampling current Is when the multi-mode circuit works in a boost mode according to an embodiment of the present invention.

FIG. 7 shows waveforms 004 of the inductive current IL and the third sampling current Is when the multi-mode circuit works in the boost mode according to an embodiment of the present invention. In the embodiment illustrated in FIG. 7, when the multi-mode circuit works in the boost mode, the first switch SWA is configured to be turned on, the second switch SWB is configured to be turned off, and the third switch SWC and the fourth switch SWD are configured to be turned on alternately. From the moment t0 to a moment t1', the first switch SWA and the third switch SWC are on, the second switch SWB and the fourth switch SWD are off, the inductive current IL increases with a slope AC, and no current flows through the fourth switch SWD, the third sampling current Is equals to zero. From the moment t1' to the moment t0+T, the first switch SWA and the fourth switch SWD are on, the second switch SWB and the third switch SWC are off, the inductive current IL decreases with the slope AD, and the third sampling current Is equals to first sampling current Isa. From the moment t0+T to a moment t1+T, the first switch SWA and the third switch SWC are on, the second switch SWB and the fourth switch SWD are off, the inductive current IL increases with the slope AC, and no current flows through the fourth switch SWD, the third sampling current Is equals to zero. From the moment t1' to a moment t0+2T, the first switch SWA and the fourth switch SWD are on, the second switch SWB and the third switch SWC are off, the inductive current IL decreases with the slope AD, and the third sampling current equals to the first sampling current Isa.

As illustrated in the dash area in FIG. 7, during one cycle from t0 to t0+T or one cycle from t0+T to t0+2T, the inductive current IL flows through the fourth switch SWD only during a period from t1' to t0+t or a period from t1'+T to t0+2T, and the current flowing through the first switch SWA is equal to the current flowing the fourth switch SWD during the period from t1' to t0+2 or the period from t1'+T to t0+2T, therefore, the current processing circuit 20 is configured to provide the third sampling current Is equal to the first sampling current Isa during the period from t1' to t0+T or the period from t1'+T to t0+2T. In one embodiment, from the moment t1' to the moment t1+T, when the fourth switch SWD is turned on, a current peak and a turn-on delay may be produced, then because the first switch SWA has been turned on for a while, no current speak will be produced, sampling errors caused by the current peak and the turn-on delay at the turn-on moment are eliminated. Therefore, when the multi-mode circuit words in the boost mode, the current processing circuit 20 is configured to provide the third sampling current Is equal to the first sampling current Isa when the fourth switch SWD is on and to provide the third sampling current Is equal to zero otherwise, wherein the average value of the third sampling current Is of one cycle T represents the output current Iout.

Figure 8:
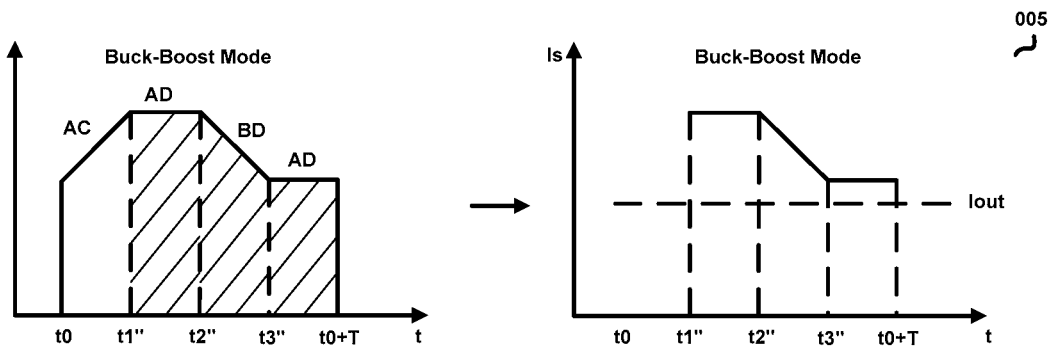
FIG. 8 shows waveforms 002 of the inductive current IL and the third sampling current Is when the multi-mode circuit works in a buck-boost mode 005 according to an embodiment of the present invention.

FIG. 8 shows waveforms 005 of the inductive current IL and the third sampling current Is when the multi-mode circuit works in the buck-boost mode according to an embodiment of the present invention. In the embodiment illustrated in FIG. 8, when the multi-mode circuit works in the buck-boost mode, the first switch SWA, the second switch SWB, the third switch SWC and the fourth switch SWD are configured to be turned on and off in pairs. From the moment t0 to a moment t1" (first period of one cycle T), the first switch SWA and the third switch SWC are on, the second switch SWB and the fourth switch SWD are off, the inductive current IL increases with the slope AC, and no current flows through the fourth switch SWD, the third sampling current Is equals to zero. From the moment t1" to a moment t2" (second period of one cycle T), the first switch SWA and the fourth switch SWD are on, the second switch SWB and the third switch SWC are off, the inductive current IL is configured to change with the slope AD, the third sampling current Is equals to the first sampling current Isa, in one embodiment, the slope AD is zero. From the moment t2" to a moment t3" (third period of one cycle T), the second switch SWB and the fourth switch SWD are on, the first switch SWA and the third MSOFET SWC are off, the inductive current IL decreases with the slope BD, the third sampling current Is equals to the second sampling current Isd. From the moment t3" to the moment t0+T (fourth period of one cycle T), the first switch SWA and the fourth switch SWD are on, the second switch SWB and the third switch SWC are off, the inductive current IL changes with the slope AD, the third sampling current Is equals to the second sampling current Isd, in one embodiment, the slope AD is zero. As shown in the dash area in the FIG. 8, during one cycle T, only from the moment t1" to the moment t0+T, the inductive current IL flows through the fourth switch SWD. In one embodiment, at the moment t1", when the transistor SWD is turned on, a current peak and a turn-on delay may be produced, and at the moment t1", the first switch SWA has been turned on for a while, so no current peak will be produced, and the turn-on delay of the first switch SWA and the fourth switch SWD is also eliminated. Therefore, when the multi-mode circuit works in the buck-boost mode, the current processing circuit 20 is configured to provide the third sampling current Is equals to zero during the first period (the fourth switch SWD is off), equals to the first sampling current Isa during the second period (a period from the turn-off moment of the third switch SWC to the turn-on moment of the second switch SWB), equals to the second sampling current Isd during the third period and the fourth period (period from the turn-on moment of the second switch SWB to the turn-on moment of the third switch SWC), wherein the average value of the third sampling current Is of one cycle T represents the output current Iout.

In the embodiments illustrated in FIG. 6 to FIG. 8, the current processing circuit 20 is configured to receive the first sampling current Isa after the first switch SWA has been turned on for a while, and the current processing circuit 20 is configured to receive the second sampling current Isd after the fourth switch SWD has been turned on for a while, so that the current peak produced when the first switch SWA is turned on and the fourth switch SWD is turned on is eliminated, and the turn-off delay of the first switch SWA and the fourth switch SWD is also eliminated.

Figure 9:
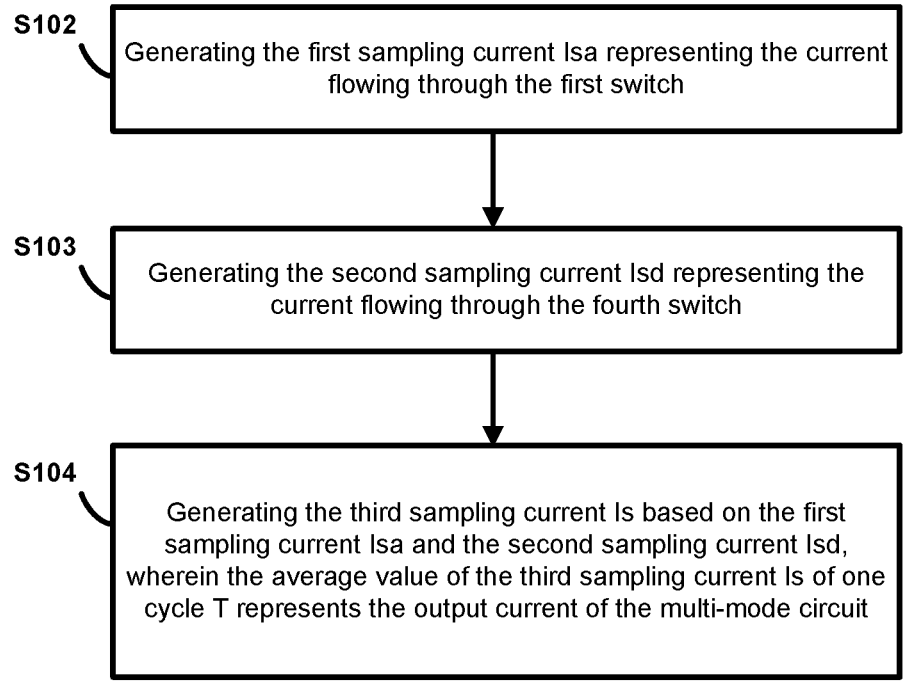
FIG. 9 shows a flow chart 006 illustrating a control method for a current sampling circuit applied to a multi-mode circuit according to an embodiment of the present invention.

FIG. 9 shows a flow chart 006 illustrating a control method for a current sampling circuit applied to a multi-mode circuit according to an embodiment of the present invention. Wherein the multi-mode circuit comprises an input voltage, an output voltage, a first switch, a second switch and a fourth switch, the multi-mode circuit is configured to work in buck mode, boost mode or buck-boost mode, the control method comprises steps S101-S103:

At the step S101, generating the first sampling current Isa representing the current flowing through the first switch.

At the step S102, generating the second sampling current Isd representing the current flowing through the fourth switch.

At the step S103, generating the third sampling current Is based on the first sampling current Isa and the second sampling current Isd, wherein the average value of the third sampling current Is of one cycle T represents the output current of the multi-mode circuit.

In one embodiment, the control method further comprises: generating a buck mode signal, a boost mode signal and a buck-boost mode signal based on an input voltage Vin and an output voltage Vout of the multi-mode circuit, generating a first enable signal and a second enable signal based on whether the second switch and the third switch are on or off, and generating the third sampling current Is further based on the buck mode signal, the boost mode signal, the buck-boost mode signal, the first enable signal and the second enable signal.

In one embodiment, the third sampling current Is equals to the second sampling current Isd during an entire period when the multi-mode circuit works in buck mode, the third sampling current Is equals to the first sampling current Isa during a period when the fourth switch is on and equals to zero otherwise when the multi-mode circuit works in boost mode, the third sampling current Is equals to zero during the first period, equals to the first sampling current during the second period, and equals to the second sampling current during the third period and the fourth period when the multi-mode circuit works in buck-boost mode, wherein one cycle T of the buck-boost mode comprises four periods: the first period, the second period, the third period and the fourth period.

In one embodiment, when the multi-mode circuit works in buck mode, the third switch is off, the fourth switch is on, and the first switch and the second switch are turned on and off alternately; when the multi-mode circuit works in boost mode, the first switch is on, the second switch is off, the third switch and the fourth switch are turned on and off alternately; and when the multi-mode circuit works in buck-boost mode, during the first period, the first switch and the third switch are on, the second switch and the fourth switch are off, during the second period, the first switch and the fourth switch are on, the second switch and the third switch are off, during the third period, the second switch and the fourth switch are on, the first switch and the third switch are off, and during the fourth period, the first switch and the fourth switch are on, the second switch and the third switch are off.

In one embodiment, the current processing circuit is configured to receive the first sampling current after the first switch has been turned on for a while, and the current processing circuit is configured to receive the second sampling current after the fourth switch has been turned on for a while.

Note that in the flow chart described above, the box functions may also be implemented with different order as shown in FIG. 9. For example, two successive box functions may be executed meanwhile, or sometimes the box functions may be executed in reverse order.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A power switching circuit, comprising:
a multi-mode circuit, comprising a first switch, a second switch, a third switch and a fourth switch, wherein the multi-mode circuit is configured to work in buck mode, boost mode or buck-boost mode;
a current sampling circuit, coupled to the first switch and the fourth switch, and configured to provide a first sampling current representing a current flowing through the first switch and to provide a second sampling current representing a current flowing through the fourth switch; and
a current processing circuit, configured to generate a third sampling current based on the first sampling current and the second sampling current, wherein the third sampling current equals to the second sampling current during an entire period when the multi-mode circuit works in buck mode, the third sampling current equals to the first sampling current during a period when the fourth switch is on and equals to zero otherwise when the multi-mode circuit works in boost mode, the third sampling current equals to zero during a first period, equals to the first sampling current during a second period, and equals to the second sampling current during a third period and a fourth period when the multi-mode circuit works in buck-boost mode; wherein
one cycle of the buck-boost mode comprises four periods: the first period, the second period, the third period and the fourth period.

2. The power switching circuit of claim 1, further comprising:
when the multi-mode circuit works in buck mode, the third switch is off, the fourth switch is on, and the first switch and the second switch are turned on and off alternately;
when the multi-mode circuit works in boost mode, the first switch is on, the second switch is off, the third switch and the fourth switch are turned on and off alternately; and
when the multi-mode circuit works in buck-boost mode, during the first period, the first switch and the third switch are on, the second switch and the fourth switch are off, during the second period, the first switch and the fourth switch are on, the second switch and the third switch are off, during the third period, the second switch and the fourth switch are on, the first switch and the third switch are off, and during the fourth period, the first switch and the fourth switch are on, the second switch and the third switch are off.

3. The power switching circuit of claim 1, wherein the current sampling circuit comprises:
a first sampling circuit, configured to sample the current flowing through the first switch; and
a second sampling circuit, configured to sample the current flowing through the fourth switch.

4. The power switching circuit of claim 3, wherein the first sampling circuit comprises:
a first transistor, configured to mirror the current flowing through the first switch, and a gate terminal of the first transistor is coupled to a gate terminal of the first switch to receive a first gate driving signal;
a first sampling resistance, coupled between the first switch and the first transistor; and
a first amplifying circuit, configured to amplify a voltage across the first sampling resistance and to generate the first sampling current.

5. The power switching circuit of claim 3, wherein the second sampling circuit comprises:
a second transistor, configured to mirror the current flowing through the fourth switch, and a gate terminal of the second transistor is coupled to a gate terminal of the fourth switch to receive a fourth gate driving signal;
a second sampling resistance, coupled between the fourth switch and the second transistor; and
a second amplifying circuit, configured to amplify the voltage across the second sampling resistance and to generate the second sampling current.

6. The power switching circuit of claim 1, wherein the current processing circuit comprises:
a working mode signal generating circuit, configured to generate a buck mode signal, a boost mode signal and a buck-boost mode signal based on an input voltage and an output voltage of the multi-mode circuit; and
an enable signal generating circuit, configured to generate a first enable signal and a second enable signal based on a second gate driving signal coupled to a terminal of the second switch and a third gate driving signal coupled to a terminal of the third switch.

7. The power switching circuit of claim 6, wherein the current processing circuit comprises:
a third transistor, having a first terminal, a second terminal and a third terminal, wherein the second terminal of the third transistor is configured to receive the first sampling current, and the third terminal of the third transistor is configured to receive the boost mode signal;
a fourth transistor, having a first terminal, a second terminal and a third terminal, wherein the second of the fourth transistor is coupled to the first terminal of the third transistor, and the third terminal of the fourth transistor is configured to receive the fourth gate driving signal;
a fifth transistor, having a first terminal, a second terminal and a third terminal, wherein the second terminal of the fifth transistor is coupled to the second terminal of the third transistor to receive the first sampling current, and the third terminal of the fifth transistor is configured to receive the buck-boost mode signal;
a sixth transistor, having a first terminal, a second terminal and a third terminal, wherein the second terminal of the sixth transistor is coupled to the first terminal of the fifth transistor, and the third terminal of the sixth transistor is configured to receive the first enable signal;
a seventh transistor, having a first terminal, a second terminal and a third terminal, wherein the second terminal of the seventh transistor is configured to receive the second sampling current, and the third terminal of the seventh transistor is configured to receive the buck mode signal;
an eighth transistor, having a first terminal, a second terminal and a third terminal, wherein the second terminal of the eighth transistor is coupled to the second terminal of the seventh transistor to receive the second sampling current, and the third terminal of the eighth transistor is configured to receive the buck-boost mode signal; and
a ninth transistor, having a first terminal, a second terminal and a third terminal, wherein the drain of the ninth transistor is coupled to the second terminal of the eighth transistor, and the third terminal of the ninth transistor is configured to receive the second enable signal; wherein
the first terminal of the fourth transistor, the first terminal of the sixth transistor, the first terminal of the seventh transistor and the first terminal of the ninth transistor are coupled to a common point to provide the third sampling current.

8. The power switching circuit of claim 6, wherein the working mode signal generating circuit comprises:
   a first comparison circuit, configured to generate the buck mode signal based on a compare result of the input voltage and a first voltage signal, wherein the first voltage signal is configured to be greater than the output voltage;
   a second comparison circuit, configured to generate the boost mode according to a compare result of the output voltage and a second voltage signal, wherein the second voltage signal is configured to be greater than the input voltage; and
   an logic circuit, configured to generate the buck-boost mode based on the buck mode signal and the boost mode signal.

9. The power switching circuit of claim 6, wherein the enable signal generating circuit comprises:
   a first RS trigger, having a set terminal, a reset terminal and an output terminal, wherein the set terminal is configured to receive a falling edge of the third gate driving signal, the reset terminal is configured to receive a rising edge of the second gate driving signal; and
   a second RS trigger, having a set terminal, a reset terminal and an output terminal, wherein the set terminal of the second RS trigger is configured to receive the rising edge of the second gate driving signal, and the reset terminal of the second RS trigger is configured to receive a rising edge of the third gate driving signal.

10. The power switching circuit of claim 1, further comprising:
    a capacitor, coupled to the current processing circuit to receive the third sampling current; and
    an output resistance, coupled in parallel with the capacitor; wherein
    the capacitor and the output resistance are configured to provide an average value of the third sampling current of one cycle.

11. A current sampling circuit applied to a multi-mode circuit, wherein the multi-mode circuit comprises a first switch, a second switch, a third switch and a fourth switch, the multi-mode circuit is configured to work in buck mode, boost mode or buck-boost mode, the current sampling circuit comprising:
    a first sampling circuit, configured to provide a first sampling current representing the current flowing through the first switch;
    a second sampling circuit, configured to provide a second sampling current representing the current flowing through the fourth switch; and
    a current processing circuit, configured to generate a third sampling current based on the first sampling current and the second sampling current, wherein the third sampling current equals to the second sampling current during an entire period when the multi-mode circuit works in buck mode, the third sampling current equals to the first sampling current during a period when the fourth switch is on and equals to zero otherwise when the multi-mode circuit works in boost mode, the third sampling current equals to zero during a first period, equals to the first sampling current during a second period, and equals to the second sampling current during a third period and a fourth period when the multi-mode circuit works in buck-boost mode; wherein one cycle of the buck-boost mode comprises four periods: the first period, the second period, the third period and the fourth period.

12. The current sampling circuit of claim 11, wherein:
    when the multi-mode circuit is in buck mode, the third switch is off, the fourth switch is on, the first switch and the second switch are turned on and off alternately;
    when the multi-mode circuit is in boost mode, the first switch is on, the second switch is off, the third switch and the fourth switch are turned on and off alternately; and
    when the multi-mode circuit works in buck-boost mode, during the first period, the first switch and the third switch are on, the second switch and the fourth switch are off, during the second period, the first switch and the fourth switch are on, the second switch and the third switch are off, during the third period, the second switch and the fourth switch are on, the first switch and the third switch are off, and during the fourth period, the first switch and the fourth switch are on, the second switch and the third switch are off.

13. The current sampling circuit of claim 11, wherein the first sampling circuit comprises:
    a first transistor, configured to mirror the current flowing through the first switch, and a gate terminal of the first transistor is coupled to a gate terminal of the first switch to receive a first gate driving signal;
    a first sampling resistance, coupled between the first switch and the first transistor; and
    a first amplifying circuit, configured to amplify a voltage across the first sampling resistance and to generate the first sampling current.

14. The current sampling circuit of claim 11, wherein the second sampling circuit comprises:
    a second transistor, configured to mirror the current flowing through the fourth switch, and a gate terminal of the second transistor is coupled to a gate terminal of the fourth switch to receive a fourth gate driving signal;
    a second sampling resistance, coupled between the fourth switch and the second transistor; and
    a second amplifying circuit, configured to amplify the voltage across the second sampling resistance and to generate the second sampling current.

15. The current sampling circuit of claim 11, wherein the current processing circuit comprises:
    a working mode signal generating circuit, configured to generate a buck mode signal, a boost mode signal and a buck-boost mode signal based on an input voltage and an output voltage of the multi-mode circuit; and
    an enable signal generating circuit, configured to generate a first enable signal and a second enable signal based on a second gate driving signal coupled to a terminal of the second switch and a third gate driving signal coupled to a terminal of the third switch.

16. The current sampling circuit of claim 15, wherein the current processing circuit comprises:
    a third transistor, having a first terminal, a second terminal and a third terminal, wherein the second terminal of the third transistor is configured to receive the first sampling current, and the third terminal of the third transistor is configured to receive the boost mode signal;
    a fourth transistor, having a first terminal, a second terminal and a third terminal, wherein the second of the fourth transistor is coupled to the first terminal of the third transistor, and the third terminal of the fourth transistor is configured to receive the fourth gate driving signal;

a fifth transistor, having a first terminal, a second terminal and a third terminal, wherein the second terminal of the fifth transistor is coupled to the second terminal of the third transistor to receive the first sampling current, and the third terminal of the fifth transistor is configured to receive the buck-boost mode signal;

a sixth transistor, having a first terminal, a second terminal and a third terminal, wherein the second terminal of the sixth transistor is coupled to the first terminal of the fifth transistor, and the third terminal of the sixth transistor is configured to receive the first enable signal;

a seventh transistor, having a first terminal, a second terminal and a third terminal, wherein the second terminal of the seventh transistor is configured to receive the second sampling current, and the third terminal of the seventh transistor is configured to receive the buck mode signal;

an eighth transistor, having a first terminal, a second terminal and a third terminal, wherein the second terminal of the eighth transistor is coupled to the second terminal of the seventh transistor to receive the second sampling current, and the third terminal of the eighth transistor is configured to receive the buck-boost mode signal; and a ninth transistor, having a first terminal, a second terminal and a third terminal, wherein the drain of the ninth transistor is coupled to the second terminal of the eighth transistor, and the third terminal of the ninth transistor is configured to receive the second enable signal; wherein the first terminal of the fourth transistor, the first terminal of the sixth transistor, the first terminal of the seventh transistor and the first terminal of the ninth transistor are coupled to a common point to provide the third sampling current.

17. A control method for a current sampling circuit applied to a multi-mode circuit, wherein the multi-mode circuit comprises a first switch, a second switch, a third switch and a fourth switch, the multi-mode circuit is configured to work in buck mode, boost mode or buck-boost mode, the control method comprising:

generating a first sampling current representing a current flowing through the first switch;

generating a second sampling current representing a current flowing through the fourth switch; and generating a third sampling current based on the first sampling current and the second sampling current; wherein the third sampling current equals to the second sampling current during an entire period when the multi-mode circuit works in buck mode, the third sampling current equals to the first sampling current during a period when the fourth switch is on and equals to zero otherwise when the multi-mode circuit works in boost mode, the third sampling current equals to zero during a first period, equals to the first sampling current during a second period, and equals to the second sampling current during a third period and a fourth period when the multi-mode circuit works in buck-boost mode, wherein one cycle of the buck-boost mode comprises four periods: the first period, the second period, the third period and the fourth period.

18. The control method for a current sampling circuit of claim 17, wherein:

when the multi-mode circuit works in buck mode, the third switch is off, the fourth switch is on, and the first switch and the second switch are turned on and off alternately;

when the multi-mode circuit works in boost mode, the first switch is on, the second switch is off, the third switch and the fourth switch are turned on and off alternately; and when the multi-mode circuit works in buck-boost mode, during the first period, the first switch and the third switch are on, the second switch and the fourth switch are off, during the second period, the first switch and the fourth switch are on, the second switch and the third switch are off, during the third period, the second switch and the fourth switch are on, the first switch and the third switch are off, and during the fourth period, the first switch and the fourth switch are on, the second switch and the third switch are off.

19. The control method for a current sampling circuit of claim 17, further comprising:

generating a buck mode signal, a boost mode signal and a buck-boost mode signal based on an input voltage and an output voltage of the multi-mode circuit; and generating a first enable signal and a second enable signal based on whether the second switch and the third switch are on or off.

20. The control method for a current sampling circuit of claim 19, further comprising:

generating the third sampling current further based on the buck mode signal, the boost mode signal, the buck-boost mode signal, the first enable signal and the second enable signal.

* * * * *